United States Patent
Mulder et al.

(10) Patent No.: US 12,143,120 B2
(45) Date of Patent: Nov. 12, 2024

(54) SYSTEMS AND METHODS OF SIGNED CONVERSION

(71) Applicant: Avago Technologies International Sales Pte. Limited, Singapore (SG)

(72) Inventors: Jan Mulder, Houten (NL); Frank Van Der Goes, Zeist (NL); Mohammadreza Mehrpoo, Eindhoven (NL); Sijia Wang, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 95 days.

(21) Appl. No.: 17/976,129

(22) Filed: Oct. 28, 2022

(65) Prior Publication Data

US 2024/0146325 A1    May 2, 2024

(51) Int. Cl.
| | |
|---|---|
| *H03M 1/66* | (2006.01) |
| *H03M 1/74* | (2006.01) |
| *H03M 1/00* | (2006.01) |
| *H03M 1/08* | (2006.01) |

(52) U.S. Cl.
CPC ............ *H03M 1/662* (2013.01); *H03M 1/74* (2013.01); *H03M 1/00* (2013.01); *H03M 1/002* (2013.01); *H03M 1/0863* (2013.01); *H03M 1/66* (2013.01); *H03M 1/742* (2013.01)

(58) Field of Classification Search
CPC ...... H03M 1/662; H03M 1/74; H03M 1/0863; H03M 1/002; H03M 1/742; H03M 1/00; H03M 1/66
See application file for complete search history.

(56) References Cited

U.S. PATENT DOCUMENTS

| | | |
|---|---|---|
| 5,257,027 A | 10/1993 | Murota |
| 9,385,742 B1 * | 7/2016 | Cheng ................. H03M 1/742 |
| 9,571,120 B2 | 2/2017 | Kuttner et al. |
| 10,651,869 B1 | 5/2020 | Ponton et al. |

OTHER PUBLICATIONS

M. Beikmirza et al., "6.2 A 4-Way Doherty Digital Transmitter Featuring 50%-LO Signed IQ Interleave Upconversion with more than 27dBm Peak Power and 40% Drain Efficiency at 10dB Power Back-Off Operating in the 5GHz Band," 2021 IEEE International Solid-State Circuits Conference (ISSCC), 2021, pp. 92-94, doi: 10.1109/ISSCC42613.2021.9365831.
M. Beikmirza, Y. Shen, L. C. N. de Vreede and M. S. Alavi, "A Wideband Four-Way Doherty Bits-In RF-Out CMOS Transmitter," in IEEE Journal of Solid-State Circuits, vol. 56, No. 12, pp. 3768-3783, Dec. 2021, doi: 10.1109/JSSC.2021.3105542.

* cited by examiner

*Primary Examiner* — Joseph J Lauture
(74) *Attorney, Agent, or Firm* — Foley & Lardner LLP

(57) ABSTRACT

Described herein are systems and methods related to a converter including a first input, a second input, and a number of digital to analog converter (DAC) cells. A DAC cell includes a first circuit, a first leg associated with a first output of the DAC cell, and a second leg associated with a second output of the DAC cell. The first circuit is configured to provide a return to zero operation. The DAC cell is configured to provide a data magnitude at a polarity on at least one of the first leg or the second leg during at least a portion of the clock cycle. The data magnitude and the polarity being provided in accordance with a first signal at the first input and a second signal at the second input.

20 Claims, 5 Drawing Sheets

SYSTEMS AND METHODS OF SIGNED CONVERSION

BACKGROUND

The present disclosure relates generally to signal converters including but not limited to digital-to-analog convertors (DACs) used in radio frequency (RF) systems. DACs, such as unsigned current steering DACs operating at high signal frequencies, can suffer degraded performance (e.g., duty cycle errors) due to rising and falling edges at the data output having different and uncorrelated errors.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
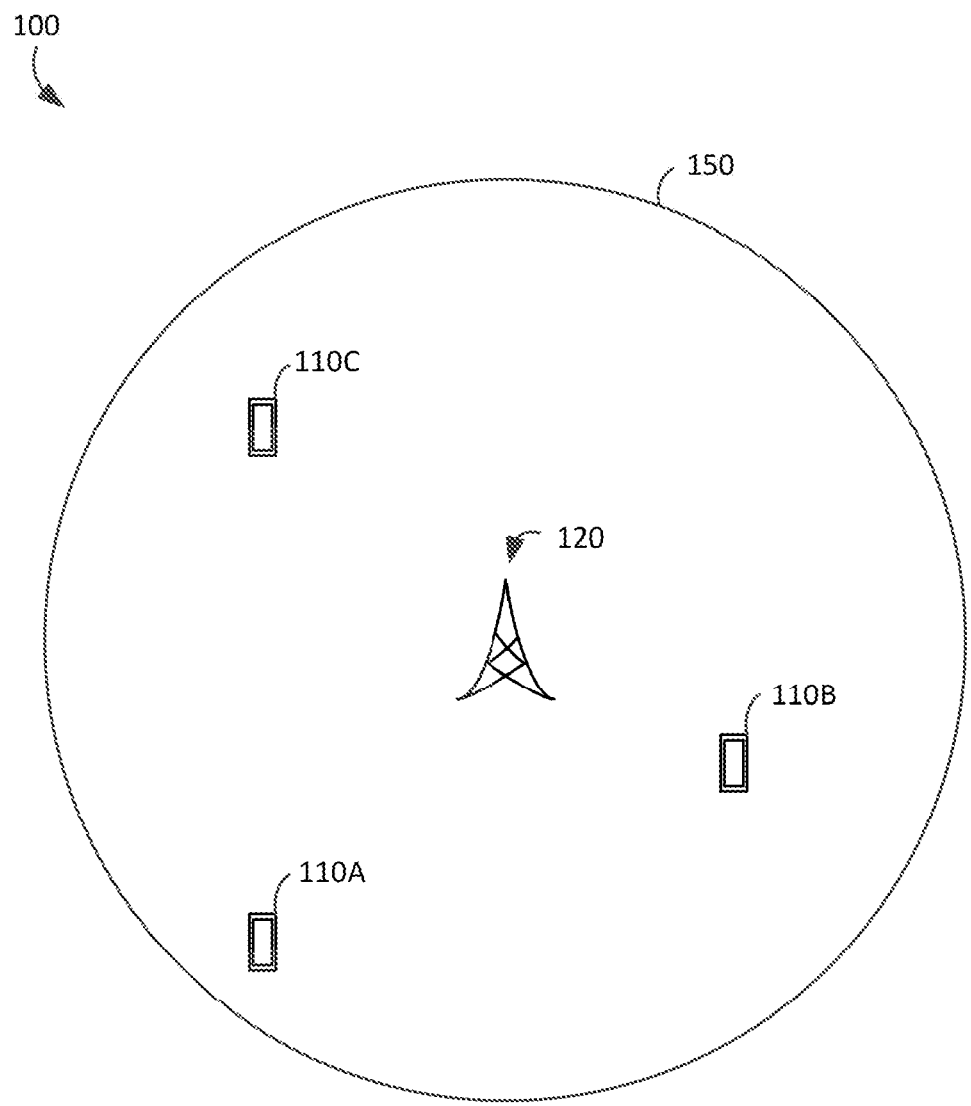
FIG. 1 is a schematic block diagram of a communication system including a base station and client devices, in accordance with some embodiments.

Referring generally to the FIGURES, an example DAC uses a number of DAC cells to provide an analog signal in response to a digital signal representing a positive or negative number. In some embodiments, the DAC is configured to reduce duty-cycle errors that create even order distortion (e.g., second order harmonic distortion (HD2)/second order intermodulation distortion (IMD2) distortion). In some embodiments, the DAC is configured as a signed return-to-zero DAC that receives a sign-bit and magnitude bits and provides an analog signal. In some embodiments, the same DAC cells are chosen for up/down transition to create an even symmetry of transition errors and thereby reduce even order distortion.

According some embodiments, DAC systems and methods advantageously reduce or effectively remove second harmonic distortion (HD2) by applying a dynamic element matching (DEM) algorithm when selecting DAC cells in some embodiments. The DAC includes four cells in some embodiments. The systems and methods use the same cells for up and down transitions so that rising and falling edges are correlated for even order symmetry. Rising and falling edges may refer to a portion of a signal where a signal increases in amplitude and to a portion of a signal where a signal decreases in amplitude, respectively. A falling edge occurs when a signal transitions from a logic level one to a logic level zero in some embodiments. A rising edge occurs when a signal transitions from a logic level zero to a logic level one in some embodiments.

In some embodiments, the sign bit is applied in the output stage of a DAC cell (e.g., close to or as close as feasible to the cascode transistor at the output). A cascode transistor may refer to a device employed to shield components of the DAC (e.g., a current source in the DAC cell or the switch transistor in the DAC cell). The cascode transistor is a device that attenuates output swing such that the signal swing is larger at the drain of the cascode transistor which is coupled to the output than at the source of the cascode transistor in some embodiments. Therefore, the cascode transistor can reduce the output swing (e.g., the range of the output signal) as experienced by the switch transistor in some embodiments.

In some embodiments, the systems and methods are used in high speed DACs and provide high spurious free dynamic range (SFDR) (e.g., 40-80 decibel relative to carrier frequency (dBc)) for 5G applications. In some embodiments, systems and methods are employed in a transmitter that does not use a local oscillator to up convert the analog signal for radio transmission. In some embodiments, the DAC is configured as a twenty five percent return to zero DAC to reduce sign signal timing error. A twenty five percent return to zero DAC is a DAC that uses a clock signal with a 75 percent duty cycle that provides a 25 percent quite period for a return to zero operation.

In one aspect, the DAC is implemented for a wireless communication. For example, the DAC can be implemented in a transmitter for radio frequency (RF) communication, such as cellular communication (3G, 4G, 5G, 6G, etc.), Wi-Fi communication, Bluetooth communication, etc. In some embodiments, the transmitter is a transmitter of a base station (e.g., eNode B (eNB), gNodeB (gNB), etc.) or client device that provides a wireless communication. In one aspect, the DAC may operate at a high speed (e.g., over 5 Gbps), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, and can be implemented in a small form factor. Moreover, modulation or upconversion of a signal in a baseband frequency (e.g., 100 MHz~1 GHz) to a RF frequency (1~10 GHz) can be performed by a digital logic circuit that may be less susceptible to noise than an analog circuit, such that the transmitter can improve a signal quality. Although the DAC disclosed herein is provided for a transmitter for a wireless communication, the DAC can be implemented for different applications. For example, the DAC disclosed herein can be implemented for a wired communication, an optical communication, or any computing device that performs high speed digital-to-analog conversion.

In some embodiments, one or more components can be embodied, in whole or part, as one or more transistors. The transistors implemented may be N-type transistors or P-type transistors. N-type transistor is a transistor that utilizes electrons as majority carriers. P-type transistor is a transistor that utilizes holes as majority carriers. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be referred to as source/drain electrodes herein. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Some embodiments relate to a converter. The converter includes a first input, a second input, and a number of digital to analog converter (DAC) cells. A DAC cell of the DAC cells includes a first circuit, a first leg associated with a first output of the DAC cell, and a second leg associated with a second output of the DAC cell. The first circuit is configured to couple the first leg to the second leg during a first time period within a clock cycle. The DAC cell is configured to provide a signal having a data magnitude at a polarity on at least one of the first leg or the second leg during at least a portion of the clock cycle. The data magnitude and the polarity are provided in accordance with a first signal at the first input and a second signal at the second input. A data magnitude may refer to a characteristic of a signal related to an amount or amplitude of a signal in some embodiments. Data magnitude can be represented by one or more bits of a digital input signal. The polarity may refer to condition of a signal being in a positive state or a negative state (e.g., above or below a logic level zero or ground) in some embodiments. The can be represented by one or more bits of a digital input signal in some embodiments.

In some embodiments, the first signal is a sign signal indicative of the polarity and the second signal is a data signal indicative of the data magnitude. In some embodiments, the first circuit comprises a first pair of transistors and a second pair of transistors coupled between the first leg and the second leg. The first pair of transistors are each N-channel transistors and the second pair of transistors are each P-channel transistors. In some embodiments, the first circuit performs a return to zero operation. A data signal may refer to a signal indicative of a data magnitude for an output signal of a DAC cell. The data signal is a digital signal (e.g., one or more bits) in some embodiments. A sign signal may refer to a signal indicative of a polarity for an output signal of a DAC cell. The sign signal is a digital signal (e.g., one or more bits) in some embodiments. A digital sign signal may refer to a sign signal represented by one or more bits. A digital magnitude signal may refer to a sign signal represented by one or more bits.

In some embodiments, the converter further includes a second circuit configured to select same DAC cells for up and down transitions so that rising and falling edges at the first output and the second output are correlated.

In some embodiments, the first time period is a twenty five percent of the clock cycle. In some embodiments, the first signal is a sign signal indicative of the polarity and the second signal is a data signal indicative of the data magnitude. Transitions of the sign signal are provided during the first time period. In some embodiments, the first period is a last period of the clock cycle. Transitions of the sign signal may refer to a change from a first level (e.g., logic level) to a second level of the sign signal.

In some embodiments, a first signal is provided to a first transistor provided on the first leg and the data signal is combined with a clock signal associated with the clock cycle and provided to a second transistor. In some embodiments, the first transistor is provided between the second transistor and the first output. In some embodiments, the first transistor is provided between the second transistor and a cascode transistor coupled to the first output.

Some embodiments relate to a converter. The converter includes a number of digital to analog converter (DAC) cells. The DAC cells each comprise a first transistor, a second transistor, a third transistor, and a fourth transistor. The first transistor is configured to provide a first signal at a first node at least in part in response to a data signal, and the second transistor is configured to provide the first signal to a first output in response to a sign signal. The third transistor is configured to provide the first signal to a second output in response to an inverse signal of the sign signal. The fourth transistor is configured to couple a second node coupled to the second transistor to a third node coupled to the third transistor during a first time period within a clock cycle.

In some embodiments, the transitions of the sign signal are provided during the first period. In some embodiments, the DAC cells are current mode digital to analog converter cells. In some embodiments, a gate of the first transistor receives the data signal combined with a clock signal associated with the clock cycle in a logic AND operation.

In some embodiments, the converter further includes a cascode transistor coupled to the first output. The cascode transistor is disposed between the first output and the second transistor.

Some embodiments relate to a method of converting a digital sign signal and a digital magnitude signal to an analog signal. The method includes providing a first current signal to a first leg coupled to a first output of a digital to analog converter (DAC) cell at least partially in response to a data signal being a first logic level for the data signal and a sign signal being a first logic level for the sign signal. The method also includes coupling the first leg to a second leg of the DAC cell during a first time period within a first clock cycle. The first period being after the first current signal is provided to the first leg. The method also includes providing a second current signal to the second leg coupled to a second output at least partially in response to the data signal being the first logic level for the data signal and the sign signal being a second logic level for the sign signal. The method also includes coupling the first leg to the second leg during a second time period within a second clock cycle, the second time period being after the second current signal is provided to the second leg.

In some embodiments, the method further includes not providing the first current signal to the first leg or the second current signal to the second leg in response to the data signal being a second level for the data signal. In some embodiments, the method further includes providing the data signal to the DAC cell using a first circuit. The first circuit is configured to select the DAC cell to receive the data signal so that rising and falling edges of signals at the first output and the second output are correlated.

In some embodiments, the method further includes providing current from a power node through a third leg at least partially in response to the data signal being a second level. In some embodiments, the first period is a last quarter of the first clock cycle.

FIG. 1 illustrates a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as video data, audio data, image data, text, etc.

In some embodiments, the base station 120 may be a device configured to provide a wireless communication to client devices 110 within a geographical boundary 150. Examples of the base station include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
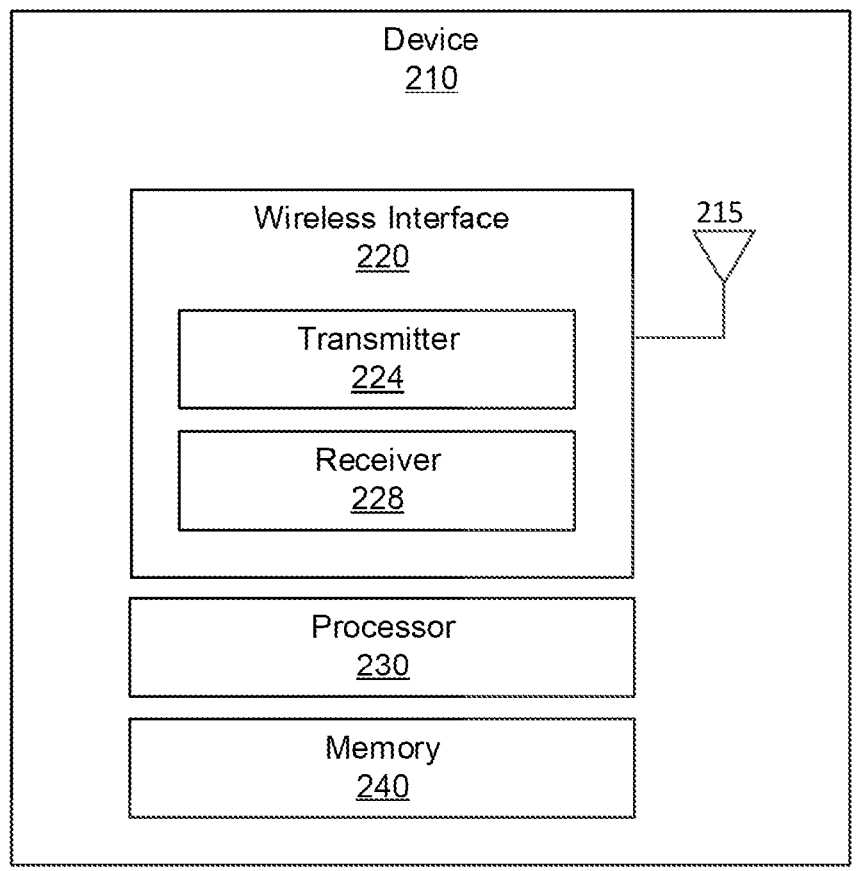
FIG. 2 is a schematic block diagram of a device for communication through a wireless communication link, in accordance with some embodiments.

FIG. 2 illustrates a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0~1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal at the RF from an antenna 215, and downconvert the RF signal to a baseband frequency (e.g., 0~1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215.

The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency from the wireless interface 220, and decode or process data included in or represented by the downconverted signal. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

Figure 3:
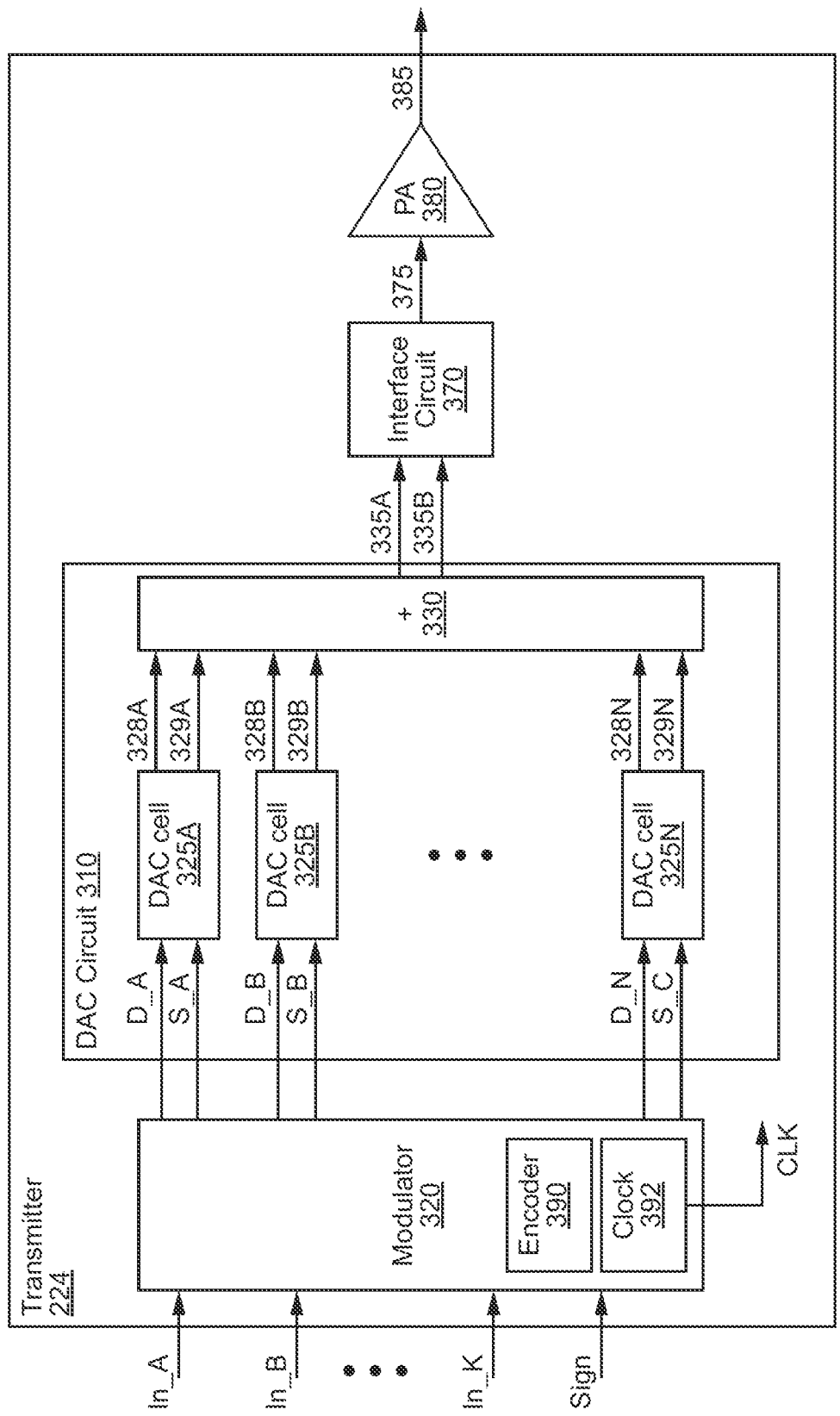
FIG. 3 is a schematic block diagram of a transmitter including a DAC, in accordance with some embodiments.

FIG. 3 illustrates a schematic diagram of a transmitter 224, in accordance with some embodiments. In some embodiments, the transmitter 224 includes a DAC (also referred to as "a DAC circuit 310"), a modulator 320, an interface circuit 370, and a power amplifier (PA) 380. These components may operate together to generate a RF signal 385 for transmission. In one aspect, the modulator 320 operates in a digital domain, where the interface circuit 370 and the PA 380 operate in an analog domain. The DAC circuit 310 may operate in both the analog domain and the digital domain, and may operate as an interface between the modulator 320 operating in the digital domain and the interface circuit 370 and the PA 380 operating in the analog domain. In some embodiments, the transmitter 224 includes more, fewer, or different components than shown in FIG. 3. For example, the modulator 320 may be implemented as part of the processor 230. Although DAC circuit 310 is shown as part of transmitter 224, DAC circuit 310 can be employed in other devices including but not limited to optical devices (e.g., optical transceivers or sensors) and computing devices. As described below, DAC circuit 310 is configured to reduce or effectively remove second harmonic distortion (HD2) by applying a DEM algorithm and as a signed return-to-zero DAC in some embodiments.

In some embodiments, the modulator 320 is a circuit or a component that may receive a baseband signal including K-bit data In_A . . . In_K in a digital representation, and perform modulation or upconversion on the K-bit data In_A . . . In_K. A modulation or an upconversion may be multiplying a value represented by the K-bit data In_A . . . In_K by a sine function or a cosine function of a carrier frequency at RF. A carrier frequency may be a frequency (e.g., 2 GHz or 60 GHz), at which a wireless signal can be transmitted. In one approach, the modulator 320 can perform multiplication of the value represented by the K-bit data In_A . . . In_K and the sine function or the cosine function of the carrier frequency by a digital logic circuit to obtain N-bit data D_A . . . D_N representing an upconverted signal at RF. The modulator 320 may provide the N-bit data D_A . . . D_N in a digital representation to the DAC circuit 310.

In some embodiments, the DAC circuit 310 is a circuit or a component that may perform a digital-to-analog conversion. In some embodiments, the DAC circuit 310 includes a number of DAC cells 325A . . . 325N, and a summer circuit 330. DAC cells 325A-N can be any number of cells (e.g., 2, 3, 4, 8, etc.). In some embodiments, the number of cells is four. The DAC cells 325A . . . 325N may operate together to receive N-bit data D_A . . . D_N in a digital representation, and provide signals at outputs 335A, 335B in an analog representation corresponding to the N-bit data D_A . . . D_N. The digital representation can include a sign signal or sign bit (Sign). For example, voltage amplitudes of the signals at outputs 335A, 335B may represent or correspond to a value of the N-bit data D_A . . . D_N and the sign bit. In some embodiments, the DAC circuit 310 includes more, fewer, or different components than shown in FIG. 3.

In some embodiments, a DAC cell such as one of DAC cells 325A-N may refer to any circuit or a component that receives digital data (e.g., a 1 bit signal DA), and a digital sign signal S (e.g., a 1 bit signal SA) and provides an output for an analog signal. The output can be a current or voltage representative of the digital data and the sign data. The DAC cell can be a current mode or voltage mode DAC cell in some embodiments. A DAC cell 325A is described below and is similar to or identical any or all of DAC cells 325B-N in some embodiments. DAC cells 325A-N include outputs 328A-N and 329A-N that provide signals (e.g., current) corresponding to the one bit data D and the sign signal for reception by summer circuit 330. In some embodiments, the DAC cell 325A includes an input port coupled to the modulator 320 to receive data signal D_A and an input port coupled to receive sign signal S_A. Sign signals S_A, and S_B-S_N can be identical or related signals. In some embodiments, the DAC cell 325A includes an output ports or outputs 328A and 329B coupled to summer circuit 330. Outputs 328A and 329B provide a differential current signal in some embodiments. A port may be a pad, a contact, a metal rail, or any conductive component that can receive or provide an electrical signal (e.g., a voltage or a current). An input port may be a port to receive a signal, where an output port may be a port to provide or output a signal. In this configuration, a DAC cell 325A may receive a one bit data D_A and a 1 bit sign signal S_A, and provide an output signal at outputs 328A and 329B having an amplitude corresponding to the one bit data D_A and a positive or negative characteristic (e.g., polarity) corresponding to the sign signal S_A. For example, in response to the one bit data D_A having a value '0', the DAC cell 325A may bypass providing a current. For example, in response to the one bit data D_A having a value '1' and the one bit sign S_A, the DAC cell 325A may provide a signal at outputs 328A and 328B having a certain amplitude and polarity to summer circuit 330. A current provided (e.g., sunk or sourced) to summer circuit 330 on output 328A can be considered a signal having positive polarity, and a current provided to output 329A can be considered a signal having negative polarity in some embodiments. Detailed description on exemplary implementations and operations of the DAC cell 325A is provided below with respect to FIG. 4. DAC circuit 310 is a current mode DAC in some embodiments. A current mode DAC is a DAC that accumulates current from DAC cells 325A . . . 325N to provide the analog output and can be a unary current DAC.

In some embodiments, the summer circuit 330 is a circuit or a component that can accumulate or otherwise provide current signals at outputs 335A-B corresponding to current signals provided on outputs 238A-N and 329A-N from a set of DAC cells 325A . . . 325N. Outputs 335A-B provide a differential current signal in some embodiments. In some embodiments, the summer circuit 330 includes various components for adding differential current signals provided at outputs 328A-N and 329A-N. In some embodiments, the summer includes an operation amplifier, a current mirror, a current source, resistors or other circuit elements that can combine currents or outputs 328A-N and 329A-N from the set of DAC cells 325A-N and generate or provide signals at outputs 335A, 335B corresponding to the combined current. In some embodiments, the summer circuit 30 can be or include a resistor ladder. In some embodiments, an amplitude of the combined current corresponds to amplitudes of the voltage at outputs 335A, 335B. For example, for '+0001' of 4-bit input data corresponding to a value '1', a difference in amplitudes of the voltage signals at outputs 335A, 335B may be 100 mV corresponding to a current from a single DAC cell of DAC cells 325A-N. For example, for '-0001' of 4-bit input data corresponding to a value '1', a difference in amplitudes of the voltage signals at outputs 335A, 335B may be -100 mV corresponding to a current from a single DAC cell of DAC cells 325A-N. For example, for '+0111' of 4-bit input data corresponding to a value '3', a difference in amplitudes of the voltage signals at outputs 335A, 335B may be 300 mV corresponding to currents from three of the DAC cells 325A-N.

According to various embodiments, the DAC circuit 310 may include circuitry and components to convert a digital signal into an analog signal, such as wireless (e.g., radio frequency (RF)) and/or wireline signals (e.g., fiber optic, copper-wire, twisted pair, etc.). The DAC circuit 310 may include DACs of various architectures and/or designs, including, without limitation, pulse-width modulation (PWM) DACs, delta-sigma DACs, thermometer-coded DACs, oversampling DACs, noise-shaped DACs, digitally-controlled oscillators, resistor DACs (e.g., resistor ladder (R-2R) DACs), current DACs, voltage DACs, switched-capacitor DACs, unary DACs, binary-weighted DACs, or other suitable DAC designs. In further embodiments, DACs may implement a combination of designs, using a combination of components (e.g., resistors, capacitors, current sources, voltage sources, etc.). In yet further examples, the DAC circuit 310 may be part of an ADC. For example, the DAC circuit 310 may form at least part of a clock-data-recovery (CDR) circuit of an ADC. For example, the DAC circuit 310 may be a phase interpolator DAC configured to output an analog signal based on a phase interpolator code.

In some embodiments, the interface circuit 370 is a circuit or a component that may interface between the DAC circuit 310 and the PA 380. Examples of the interface circuit 370 include a balun, an impedance matching circuit, etc. In one configuration, the interface circuit 370 includes a first input port coupled to a first output port of the summer circuit 330, a second input port coupled to a second output port of the summer circuit 330, and an output port coupled to an input port of the PA 380. In this configuration, the interface circuit 370 may convert differential signals at outputs 335A, 335B into a signal 375. For example, the interface circuit 370 may obtain a difference in amplitudes of the signals at outputs 335A, 335B, and provide the difference as the signal 375. In one aspect, the interface circuit 370 may provide impedance matching between the DAC circuit 310 and the PA 380, such that the input port of the PA 380 may have a certain impedance within a range (e.g., 40~60 ohm) to ensure that the PA 380 can operate properly.

In some embodiments, the PA 380 is a circuit or a component that can amplify the signal 375 to obtain the RF signal 385 for driving the antenna 215. In some embodiments, the PA 380 includes a single amplifier circuit or two or more amplifier circuits connected in cascade. In one configuration, the PA 380 includes an input port coupled to an output port of the interface circuit 370, and an output port coupled to the antenna 215. In this configuration, the PA 380 can amplify an amplitude of the signal 375 to obtain the RF signal 385 having an amplified amplitude, and provide the RF signal 385 to the antenna 215 for transmission.

In some embodiments, an encoder 390 (e.g., constant transition rate (CTR)-DEM encoder) may be configured to receive input data In_A . . . In_K and the sign signal and provide data signals DA_A-D_N and sign signals S_A-S_N. In some embodiments, CTR-DEM logic may be implemented in hardware, software, or a combination of hardware and software. In some examples, the CTR-DEM logic may be implemented, without limitation, as a circuit (including logical circuits), custom integrated circuits (ICs), application specific circuit (ASIC), or field-programmable gate array (FPGA) implementations. In other examples, encoder 390 may be implemented as part of a DAC controller. For example, encoder 390 may be implemented as part of the firmware of a DAC controller.

In some embodiments, encoder 390 is configured to select the same DAC cells 325A-325N used for up transitions and as the DAC cells 325A-325N used for down transitions. Up and down transitions may refer to a change in the current provided to summer circuit 330 and can be due to a change in the number data signals DA_A-D_N or a change in the state of sign signals S_A-S_N in some embodiments. A cell is selected by providing logic 1 for the data signal (data signals DA-DN) for the particular cell in some embodiments. Using the same DAC cells 325A-325N for up and down transitions provides even symmetry for error which reduces distortion (e.g., second order harmonic distortion (HD2)/second order intermodulation distortion (IMD2)) distortion For example, if the DAC cell 325A and DAC cell 325B are each providing current according to a positive digital 0010 input (by providing the data signal D_A and D_B and the signals S_A and S_B as a logic one), then DAC cells 325A and 325B should be selected for providing current corresponding to a negative digital 0010 input (by providing the data signal D_A and D_B as a logic 1 and the signals S_A and S_B as a logic zero). In this way, rising and falling edges of signals at the outputs 328X and 329X are correlated (e.g., including rising and falling timing errors associated with the positive to negative transition) and have even order symmetry. Correlated may refer to a change in the signals at outputs 328A N and 329A-N due to an input change corresponding to an opposite change in the signals at outputs 328A N and 329A-N due to an opposite input change (e.g., the rising and falling edges of signals at the outputs 328X and 329X due to input changes are inversely matched) in some embodiments. In another example, if the DAC cell 325B is providing current according to a positive digital input (by providing the data signal D_B and the S_B as a logic one), then DAC cell 325B should be selected for providing current corresponding to a negative digital 0001 input (by providing the data signal D_B and the signal S_B as a logic zero). In another example, if the DAC cell 325A and DAC cell 325B are each providing current according to a negative digital 0010 input (by providing the data signal D_A and D_B and the signals S_A and S_B as a logic zero), then DAC cells 325A and 325B should be selected for providing current corresponding to a positive digital 0010 input (by providing the data signal D_A and D_B as a logic one and the signals S_A and S_B as a logic one). In some embodiments, by using encoder 390 to select the same cells for positive and negative transitions a SFDR of 85.8 dBc can be achieved when combined with a return to zero operation. In some embodiments, a return to zero DAC that does not select the same cells for positive and negative transitions has an SFDR of 68.2 SFDR. The lower performance is due to third order and second order harmonic distortion.

It should be noted that the various logic and subcomponents may be used to implement encoder 390. Encoder 390 can be implemented as hardware, such as digital logic and/or logic circuits, utilizing various hardware and logic components. According to various embodiments, encoder 390 tracks DAC cells 325A-N used in transitions so that cells used for an up transition are used for a next down transition of the same magnitude in the opposite direction. An up/down transition may refers to a transition of signals representing a transition from one number to another. For example, up and down transitions can include transitions from +1 to 0, +1 to −1. +2 to −2, etc. and from −1 to 0, −1 to +1. −2 to +2, etc.

A clock circuit 392 can provide a clock signal for various sampling and timing operations associated with DAC circuit 310. Clock circuit 392 can be part of modulator or DAC circuit 310 and can be any circuit for generating a clock signal (including periods of a first level and a second level (e.g., a periodic pulse signal of logic one and logic zero values). Clock circuit 392 provides clock signal 502 (FIG. 5) in some embodiments. In some embodiments, clock circuit 392 is a logic circuit configured to provide a square wave clock signal or other logic signal with a 75 percent duty cycle. The clock circuit 392 can respond to a local oscillator or other frequency source and use flip flops or other logic to create the clock signal in some embodiments.

Figure 4:
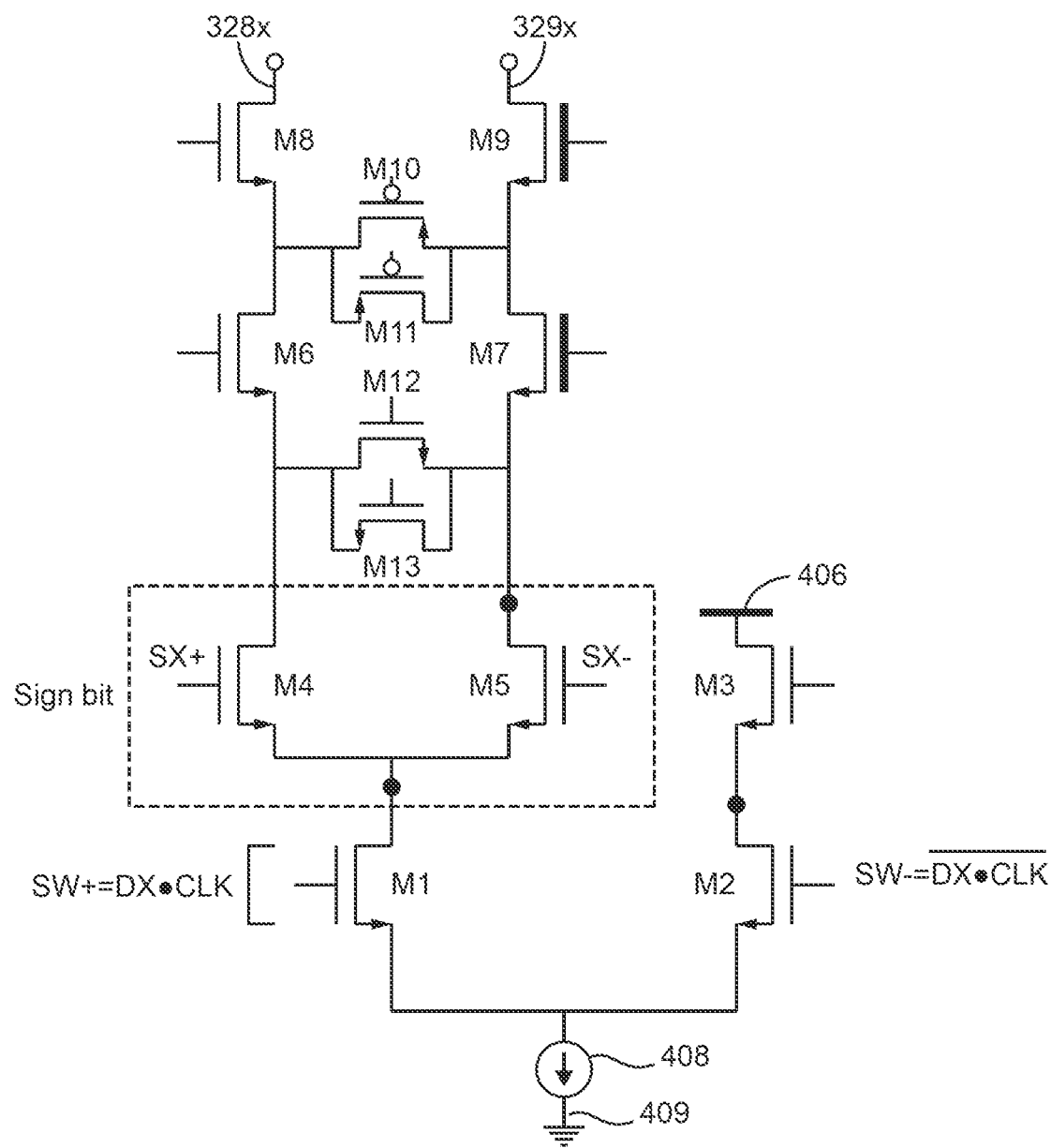
FIG. 4 is an electrical schematic diagram of a DAC cell for the DAC illustrated in FIG. 3, in accordance with some embodiments.

FIG. 4 illustrates a schematic diagram of a DAC cell 325X, in accordance with some embodiments. The DAC cell 325X may be one of the DAC cells 325A . . . 325N (FIG. 3.). The components of DAC cell 328X may operate together to provide signals at outputs 328X, 329X, corresponding to a data signal DX and a sign signal SX. In some embodiments, cell 325X includes a transistor M1, a transistor M2, a transistor M3, a transistor M4, a transistor M4, a transistor M6, a transistor M7, a transistor M8, a transistor M9, a transistor M10, a transistor M11, a transistor M12, a transistor M13, and a current source 408. Current source 408 is coupled to a ground node 409.

Transistors M1 and M2 are switch transistors or drive transistors that receive the signals SW+ and SW− at their gates, respectively. Transistor M2 is coupled in series with transistor M3 which is coupled to a power node 406 (e.g., a low voltage power source). Transistor M3 is biased at its gate to provide sink current to current source 408 when transistor M2 is turned on by the signal SW− at its gate. Transistors M4 and M5 have their sources coupled to the drain of transistor M1 which has its source coupled to the current source 408. Transistor M1 is controlled by the signal SW+t its gate and sinks current to a current source 408 when turned one by the signal SW+. Current source 408 is any circuit that delivers or absorbs current relatively independent of voltage across the circuit. Current source 408 can be active or passive and can include a diode, a transistor (e.g., enhancement mode MOST FET), an operational amplifier, or other circuit components.

Transistors M8, M6, and M4 are provided on a first leg associated with output 328X. Transistors M9, M7, and M5 are provided on a second leg associated with output 329X. Transistors M2 and M3 are provided on a third leg associated with power node 406. A leg may refer to any portion of a circuit in some embodiments. A leg can include two or more components or coupled in series or a component coupled to a node in some embodiments. A node may refer to any location in a circuit where an electrical connection can be made in some embodiments. The connection can be by a contact, conductor, or other structure capable of making an electrical connection in some embodiments. The connection can be inherent in or integral to a structure of a component in some embodiments. A power node may refer to a location where a connection to a supply of power can be made in some embodiments.

Transistors M4 and M5 control the polarity of the signal at outputs 328X and 329X. When the SX+ signal is a logic level 1 indicating a positive polarity, transistor M5 is turned off by signal SX− at its gate and transistor M4 is turned on by signal SX+ at is gate. The signal SX− is an inverted signal of SX+ in some embodiments. In this configuration, current is sunk from output 328$x$ through transistors M8 and M6 when transistor M1 is turned on indicating a positive current magnitude at output 328$x$. When the SX− signal is a logic level 1 indicating a negative polarity, transistor M5 is turned on by signal SX− at its gate and transistor M4 is turned off by signal SX− at is gate. In this configuration, current is sunk from output 329$x$ through transistors M9 and M7 when transistor M4 is turned on indicating a negative current magnitude at output 329$x$. When the data signal DX is a logic zero, transistor M2 is turned on by the signal SW− while transistor M1 is turned off by signal SW+ such that current flows through transistor M2 to current source 408 and not through transistor M1. Transistors M5 and M2 provide a dummy path for current source 408 so current source 408 sinks current when transistor M1 if turned off.

In one aspect, the transistors M6-M9 may operate as cascode transistors to protect the transistors M1, M2 (e.g., switch transistors) or transistors M4 and M5. The transistors M6-M9 may be MOSFETs, FinFETs, GaaFETs, or any transistors. The transistors M6-M9 may be N-type transistors. In some embodiments, some of the transistors M6-M9 may be implemented as P-type transistors or N-type transistors. Transistors M6 and M7 and transistors M8 and M9 may be omitted. In some embodiments, transistors M8 and M9 have thicker gate oxides than transistors M6$a$ and M7 for providing more power. Transistors M6-M9 can be biased at their gates for providing appropriate current levels at outputs 328X and 329X.

A cascode transistor can help alleviate a voltage stress. In one example, a voltage having an amplitude larger than a tolerable stress voltage of a transistor across a source electrode and a drain electrode of the transistor can damage the transistor. By implementing one or more cascode transistors, a large voltage can be distributed among the transistors connected in series. For example, a voltage between the drain electrode of the transistor M1 and the drain electrode of the transistor M8 can be shared or distributed among the transistors M1, M4, M6, and M8, such that the transistor M1 or transistor M4 can be protected. For example, a voltage between the drain electrode of the transistor M1 and the drain electrode of the transistor M9 can be shared or distributed among the transistors M1, M5, M7, M9, such that the transistor M1 or M5 can be protected.

In some embodiments, the transistors M10-M13 provide a circuit that resets the signals at outputs 328$x$ and 329$x$ in response to the signals SW+ and SW−. In some embodiments, transistors M10 and M11 are P channel transistors that are controlled by the signal SW+ such that the sources of transistors M8 and M9 are connected when the signal SW+ is negative or a logic zero. Transistors M10 has its drain coupled to the source of transistor M11, and transistors M11 has its drain coupled to the source of transistor M11 so that current flows in either direction between the sources of transistors M8 and M9 when transistors M10 and M11 are turned on. In some embodiments, transistors M11 and M12 are N channel transistors that are controlled by the signal SW− such that the sources of transistors M6 and M7 are connected when the signal SW− is positive or a logic one. Transistors M12 has its drain coupled to the source of transistor M13, and transistors M13 has its drain coupled to the source of transistor M12 so that current flows in either direction between the sources of transistors M6 and M7 when transistors M10 and M11 are turned on.

Other circuitry can be utilized to reset or equalize nodes associated with transistors M6-M9. For example, a single switch or a pair of switches can be used to reset the outputs for a return to zero operation. In some embodiments, the sign signal SX+ and/or the signal SX− are applied to transistors M4 and M5 as close to the outputs 328X and 329X as feasible. In some embodiments, transistors M4 and M5 are disposed closer to outputs 328X and 329X than transistor M1 and farther from outputs 328X and 329X than transistors M6 and M7. In some embodiments, the DAC cell 325X includes more, fewer, or different components than shown in FIG. 4.

Figure 5:
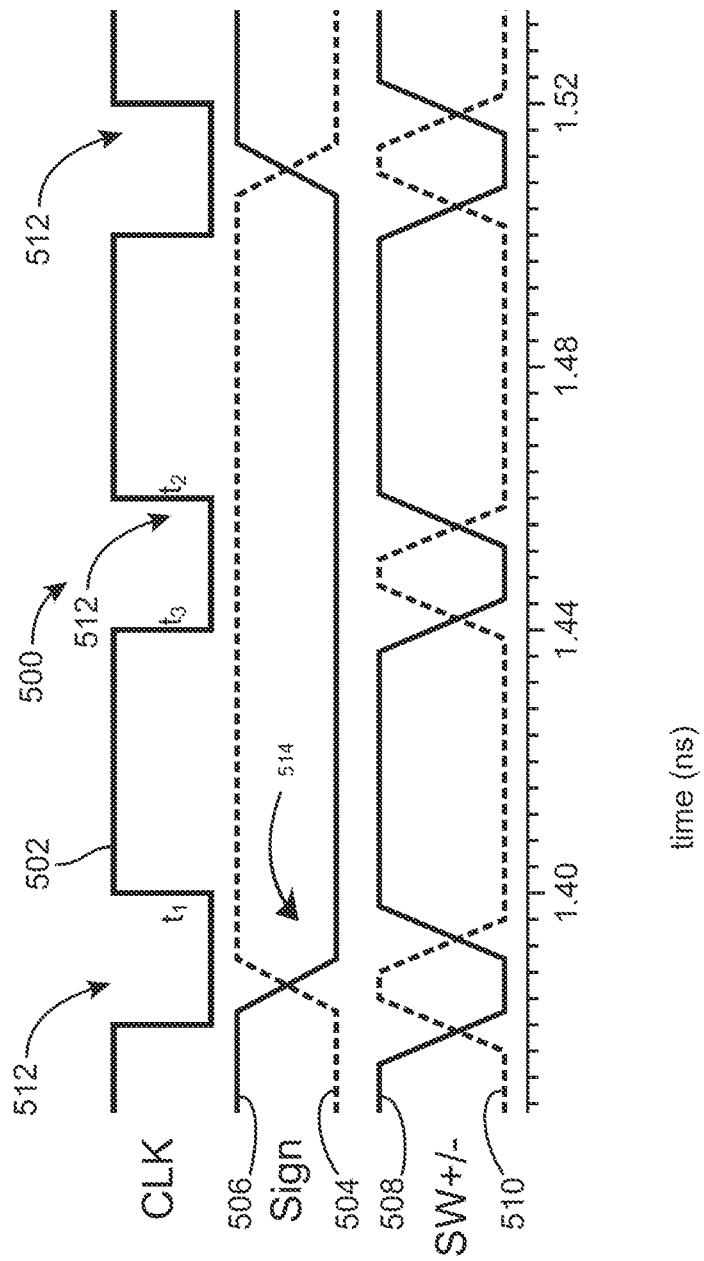
FIG. 5 is a timing diagram for signals for the DAC cell illustrated in FIG. 5, in accordance with some embodiments.

With reference to FIGS. 4-5, a logic AND function is applied to the data signal and a clock signal 502 (FIG. 5) to provide a signal 508 (SW+) and a logic NAND function is applied to the data signal and clock signal 502 to provide a signal 510 (SW−). In some embodiments, the data signal DX may be or may correspond to one of the bits or data signals D_A-D_N and sign signal SX may be or correspond to sign signal S_A-S_N. With reference to FIG. 5, a signal 504 is the sign signal SX, and a signal 506 is an inverted signal (SX−) of the sign signal 506. With reference to FIGS. 4-5, the data signal DX may be provided by the modulator 320. For example, data signal DX may have one of a first voltage (e.g., VDD or 1V) or a second voltage (e.g., GND or 0V) lower than the first voltage, according to a value of one bit to represent. For example, the data signal DX having the first voltage may represent a value '1' of one bit. For example, the data signal DX having the second voltage may represent a value '0' of one bit. The sign signal SX may be provided by the modulator 320. For example, sign signal SX may have one of a first voltage (e.g., VDD or 1V) or a second voltage (e.g., GND or 0V) lower than the first voltage, according to a value of one bit to represent. For example, the sign signal SX having the first voltage may represent a value '1' of one bit or a positive polarity. For example, sign signal SX having the second voltage may represent a value '0' of one bit or a negative.

With reference to FIG. 5, a timing diagram 500 includes a clock signal 502, sign signal 504 (e.g., signal SX+), sign signal 506 (e.g., signal SX−), a signal 508 (e.g., signal SW+), and signal 510 (e.g., signal SW−). Clock signal 502 is a signal that toggles between two voltages periodically (e.g. logic levels). In some embodiments, clock signal is provided with 90 to 60 percent of the clock cycle being a logic level 1 period and 10 to 40 percent of the clock cycle being logic level zero. In some embodiments, clock signal is provided with 75 percent of the clock cycle being a logic level 1 period and 25 percent of the clock cycle being logic level zero (provided with a 75 percent duty cycle). A clock cycle may refer to an amount of time for one period of the clock signal 502 to be completed (e.g., from time $t_1$ to time $t_2$ in FIG. 5) in some embodiments. The logic level zero portion of the clock cycle corresponds to a quiet period 512 (e.g., from time $t_3$ to time $t_2$ in FIG. 5) for transistors M10-M13 to reset signals at transistors M4-M9 for return to zero operations. The sign signals 504 and 506 are provided such that transitions 514 of the sign signals 504 and 506 are provided during the quiet period 512 in some embodiments.

A return to zero operation may refer to any operation where the signal at or near a DAC cell output is brought from a logic level one to or near a logic level zero within a clock cycle (e.g., at or near the end of the clock cycle) in some embodiments. The signal may have a DC offset when brought to zero in some embodiments. The return to zero operation generally occurs even if a number of consecutive logic ones occur in the signal in some embodiments. In some embodiments, the return to zero operation provides a zero output or rest condition between successive digital inputs. In some embodiments, the return to zero operation brings the signal associated with magnitude (data signal DX) as applied to the switch transistor (e.g., transistor M4) in a DAC cell to zero or near zero for a period of time. The period of time is associated with a quiet time or the quiet period 512 associated with clock signal 502. In some embodiment, using a logic AND combining the data signal DX and with clock signal 502 for application to the gate of transistor M1 turns off the transistor M1 during the return to zero operation. The return to zero operation reduces or eliminates timing errors to the sign signal 504 because the transitions 514 of the sign signal 504 occur during the quiet period 512 in some embodiments.

The transistors M1-M13 describe above can be any type of transistors including field effect transistors FETS, insulated gate FETs, bipolar junction transistors, etc. In some embodiments, the transistors are P-channel or N-channel metal oxide semiconductor field effect transistors (MOSFETs). A P-channel transistor includes a P channel, which is a channel composed of a majority of hole current carriers, between its source and drain. An N-channel transistor includes an N channel, which is a channel composed of a majority of electron current carriers, between its source and drain.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Any references to embodiments or elements or acts of the systems and methods herein referred to in the singular can also embrace embodiments including a plurality of these elements, and any references in plural to any implementation or element or act herein can also embrace embodiments including only a single element. The terms first and second are labels and do not accord priority, order, importance, etc. unless specifically stated. References in the singular or plural form are not intended to limit the presently disclosed systems or methods, their components, acts, or elements to single or plural configurations. References to any act or element being based on any information, act or element can include embodiments where the act or element is based at least in part on any information, act, or element.

Any implementation disclosed herein can be combined with any other implementation, and references to "an implementation," "some embodiments," "an alternate implementation," "various implementation," "one implementation" or the like are not necessarily mutually exclusive and are intended to indicate that a particular feature, structure, or characteristic described in connection with the implementation can be included in at least one implementation. Such terms as used herein are not necessarily all referring to the same implementation. Any implementation can be combined with any other implementation, inclusively or exclusively, in any manner consistent with the aspects and embodiments disclosed herein. In the above description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modifiable for application parameters or system criteria. In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise. The term in associated with may refer to a relationship (e.g., locational, signal, etc.) in some embodiments. For example, a leg can be associated with an output because it is the leg that is coupled to or near an output in some embodiments. In another example, a signal can be provided in accordance with another signal because the signals are at least related in part (e.g., by function, logic operation, enablement, disablement, or otherwise) in some embodiments. A port may refer to a node for receiving or providing a signal for any circuit (e.g., an input node or an output node) in some embodiments.

The hardware system may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The integrated circuit package can be a combination of two or more packages in some embodiments. A last period of a clock cycle may refer to a portion of the clock cycle at the end of the clock cycle (e.g., a period that ends at or just before the end of the clock cycle) in some embodiments.

The circuitry may further include or access instructions (e.g., software or firmware) for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

Various implementations have been specifically described. However, many other implementations are also possible.

What is claimed is:

1. A converter, comprising:
    a first input;
    a second input; and
    a plurality of digital to analog converter (DAC) cells, wherein a DAC cell of the DAC cells comprises a first circuit, a first leg associated with a first output of the DAC cell and a second leg associated with a second output of the DAC cell, wherein the first circuit is configured to provide a return to zero operation during a first time period within a clock cycle, wherein the DAC cell is configured to provide a signal having a data magnitude at a polarity on at least one of the first leg or the second leg during at least a portion of the clock cycle, a first signal at the first input being indicative of the polarity and a second signal at the second input being indicative of the data magnitude.

2. The converter of claim 1, wherein the first signal is a sign signal indicative of the polarity and the second signal is a data signal indicative of the data magnitude.

3. The converter of claim 1, wherein the first circuit comprises a first pair of transistors and a second pair of transistors coupled between the first leg and the second leg, wherein the first pair of transistors are each N-channel transistors and the second pair of transistors are each P-channel transistors.

4. The converter of claim 1, wherein the first circuit is configured to couple the first leg to the second leg during the first time period within the clock cycle for the return to zero operation.

5. The converter of claim 1, further comprising a second circuit configured to select same DAC cells for up and down transitions so that rising and falling edges at the first output and the second output are correlated.

6. The converter of claim 1, wherein the first time period is twenty five percent of the clock cycle.

7. The converter of claim 1, wherein the first signal is a sign signal indicative of the polarity and the second signal is a data signal indicative of the data magnitude, wherein transitions of the sign signal are provided during the first time period.

8. The converter of claim 1, wherein the first time period is a last period of the clock cycle.

9. The converter of claim 1, wherein the first signal comprises a sign signal indicative of the polarity and the second signal comprises a data signal indicative of the data magnitude, wherein the first signal is provided to a first transistor provided on the first leg and the data signal is combined with a clock signal associated with the clock cycle and provided to a second transistor.

10. The converter of claim 9, wherein the first transistor is provided between the second transistor and the first output.

11. The converter of claim 9, wherein the first transistor is provided between the second transistor and a cascode transistor coupled to the first output.

12. A converter, comprising:
    a plurality of digital to analog converter (DAC) cells, wherein the DAC cells each comprise a first transistor, a second transistor, a third transistor, and a fourth transistor, the first transistor being configured to provide a first signal at a first node at least in part in response to a data signal, the second transistor being configured to provide the first signal to a first output in response to a sign signal, the third transistor being configured to provide the first signal to a second output in response to an inverse signal of the sign signal, wherein the fourth transistor is configured to couple a second node coupled to the second transistor to a third node coupled to the third transistor during a first time period within a clock cycle.

13. The converter of claim 12, wherein transitions of the sign signal are provided during the first time period.

14. The converter of claim 13, wherein a gate of the first transistor receives the data signal combined with a clock signal in a logic AND operation.

15. The converter of claim 14, further comprising a cascode transistor coupled to the first output, the cascode transistor being disposed between the first output and the second transistor.

16. A method of converting a digital sign signal and a digital magnitude signal to an analog signal, the method comprising:
    providing a first current signal to a first leg coupled to a first port of a digital to analog converter (DAC) cell at least partially in response to a data signal being a first logic level for the data signal and a sign signal being a first logic level for the sign signal;
    coupling the first leg to a second leg of the DAC cell during a first time period within a first clock cycle, the first time period being after the first current signal is provided to the first leg;
    providing a second current signal to the second leg coupled to a second port at least partially in response to the data signal being the first logic level for the data signal and the sign signal being a second logic level for the sign signal; and
    coupling the first leg to the second leg during a second time period within a second clock cycle, the second time period being after the second current signal is provided to the second leg.

17. The method of claim 16, further comprising:
    not providing the first current signal to the first leg or the second current signal to the second leg in response to the data signal being a second level for the data signal.

18. The method of claim 16, further comprising:
    providing the data signal to the DAC cell using a first circuit, wherein the first circuit is configured to select the DAC cell to receive the data signal so that rising and falling edges of signals at a first output and a second output are correlated.

19. The method of claim 16, further comprising:
providing current from a power node through a third leg at least partially in response to the data signal being a second level.

20. The method of claim 16, wherein the first time period is between 10 and 40 percent of the first clock cycle.

* * * * *